United States Patent [19]
Shaw

[11] 3,714,521
[45] Jan. 30, 1973

[54] SEMICONDUCTOR DEVICE OR MONOLITHIC INTEGRATED CIRCUIT WITH TUNGSTEN INTERCONNECTIONS

[75] Inventor: Joseph Michael Shaw, Cranbury, N.J.

[73] Assignee: RCA Corporation

[22] Filed: July 26, 1971

[21] Appl. No.: 166,012

[52] U.S. Cl.......317/234 R, 317/234 M, 317/235 AZ
[51] Int. Cl.................................................H01l 5/00
[58] Field of Search...............................317/234, 235

[56] References Cited

UNITED STATES PATENTS

| | | | |
|---|---|---|---|
| 2,973,466 | 2/1961 | Atalla et al. | 317/240 |
| 3,419,765 | 12/1968 | Clark et al. | 317/234 |
| 3,271,286 | 9/1966 | Lepselter | 204/192 |

*Primary Examiner*—John W. Huckert
*Assistant Examiner*—E. Wojciechowicz
*Attorney*—Glenn H. Bruestle

[57] ABSTRACT

The tungsten interconnections are coated with platinum where leads are to be attached. The device or circuit is sealed with a layer of silicon nitride or other protective insulating material which has no openings at or near the P-N junctions which extend to the surface of the semiconductor chip.

5 Claims, 9 Drawing Figures

PATENTED JAN 30 1973 3,714,521

SHEET 1 OF 2

INVENTOR.

JOSEPH M. SHAW

BY

W. S. Hill

AGENT

INVENTOR.
JOSEPH M. SHAW
BY
W. J. Hill
AGENT

SEMICONDUCTOR DEVICE OR MONOLITHIC INTEGRATED CIRCUIT WITH TUNGSTEN INTERCONNECTIONS

BACKGROUND OF THE INVENTION

For making electrical interconnections in silicon monolithic circuits and discrete silicon semiconductor devices, the most commonly used metal has been aluminum. It is a very good electrical conductor and adheres well to both silicon and silicon dioxide. It is also easily deposited by evaporation and can readily be defined into high-resolution patterns.

However, aluminum has a number of disadvantages. Because of the low melting point of the aluminum-silicon eutectic (577° C) and because of rapid diffusion of aluminum along grain boundaries, metallized devices cannot be heated safely above about 525° C. Furthermore, aluminum metallization exhibits certain types of failure under electrical stress, in part because of its low activation energy for self diffusion. For certain power devices, these limitations are unacceptable. Aluminum metallization is also unsatisfactory when it will be exposed to moisture or air during operation of a device, since it corrodes readily. Finally, successful multilevel metallization of integrated circuits with aluminum requires exceptionally precise control of the processing sequence to avoid high-resistance aluminum-to-aluminum contacts and undercutting of aluminum feed-throughs.

To overcome these disadvantages, a number of metallization systems have been suggested. One of these is the platinum silicide/titanium/platinum/gold metallization used with beam-lead devices. This metallization system has particular advantages for preparing hermetically sealed chips that must withstand corrosive attack by atmospheric constituents. However, the number of materials involved and the added processing steps required make this metallization system rather expensive. Molybdenum/gold metallization has been suggested, but the processing equipment is again expensive and inconvenient to use.

Tungsten offers a number of advantages as a contact metallization and interconnection material for silicon devices and integrated circuits. With respect to thermal coefficient of expansion, silicon is more closely matched by tungsten than by any other elemental metal. Tungsten contacts to heavily doped N and P type silicon are ohmic, and its resistivity is only about 2 ½ times that of aluminum. It adheres well to silicon and to silicon dioxide and can readily be defined into high-resolution patterns. It is hard, not easily scratched, and is not attacked readily by aqueous HF or by atmospheric constituents. The lowest melting point in the binary system tungsten-silicon is 1410° C. Tungsten does not diffuse readily into silicon, and its activation energy for self diffusion is one of the highest known for metals. For these reasons, it is especially suitable for power devices and for multilevel metallization applications.

However, tungsten has disadvantages as an interconnection metal for semiconductor devices and integrated circuits. One of these is that at elevated temperatures it oxidizes readily. Therefore it should not be exposed to air or other oxidizing media at temperatures over about 300° C. If it is exposed to air above this temperature, the resistivity of the connection rises due to oxide formation which results in less thickness of metal.

Other disadvantages of tungsten as an interconnection metal are that it is not readily bonded as by thermocompression wire bonding, and it is not readily wet by solder.

THE DRAWING

FIGS. 1–6 are cross-section views illustrating successive stages in manufacturing a device or circuit in accordance with the present invention; and FIGS. 7, 8 and 9 are cross-section views of alternative embodiments of devices in accordance with the invention.

DESCRIPTION OF PREFERRED EMBODIMENT

It has now been found that device connections or circuit interconnections made of deposited films of tungsten that ordinarily cannot satisfactorily have a wire bonded thereto or which are not readily wet by solder can have these disadvantages removed by having the tungsten coated with a layer of platinum. And the devices or circuits with tungsten connections or interconnections can be protected from oxidizing ambients by coating them with a layer of silicon nitride or other protective insulating layer such that the only openings through the protective layer occur at bonding pads remote from junctions.

Figure 1:
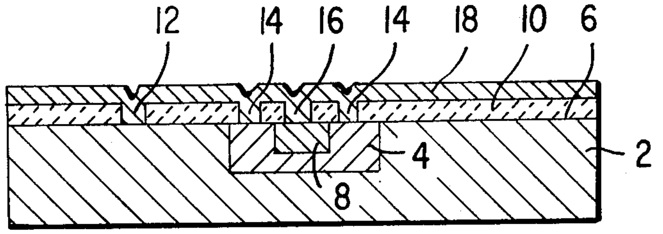

In making a device or circuit in accordance with the present invention, one may start with a semiconductor body 2 (FIG. 1) of one conductivity type silicon, which may be a discrete chip or part of a much larger wafer containing hundreds of devices or circuits. The semiconductor body 2 may contain a device such as a bipolar transistor including a diffused base region 4 extending to a surface 6 of the body. The region 4 is of opposite conductivity type to the bulk of the body 2 which serves as the collector region of the transistor. The transistor also includes a diffused emitter region 8 having the same conductivity type as the bulk of the body 2.

The device also includes a passivating layer of silicon dioxide 10 deposited on the surface 6. In the oxide layer 10 is an opening 12 exposing part of the collector region of the transistor, an opening 14 exposing part of the base region 4 and an opening 16 exposing part of the emitter region 8. These openings are made by conventional photomasking and etching techniques.

Next, a layer of tungsten 18 which may have a thickness of about 1 micron, for example, is deposited over the entire top surface of the silicon dioxide layer 10 and within the openings 12, 14 and 16. A suitable method of depositing tungsten by decomposing tungsten hexafluoride in a manner such that it will adhere satisfactorily to the oxide surface, is disclosed in U.S. Pat. No. 3,477,872 issued Nov. 11, 1969 to J. A. Amick. The process described in this patent involves decomposition of the hexafluoride in an inert gas carrier to form a very thin layer of tungsten on the exposed silicon surfaces, and etching of the oxide surface. This is followed by reduction of hexafluoride to deposit a thicker layer of tungsten on both the tungsten-coated silicon surfaces and the silicon dioxide layer.

Figure 2:
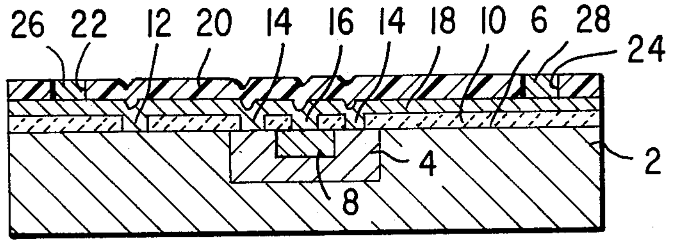

The tungsten layer 18 is then covered with a layer of photoresist 20 (FIG. 2) and openings 22 and 24 are formed therein by conventional exposing and developing methods.

A layer of platinum 26 is then deposited on the tungsten layer 18 within the opening 22 and another layer of platinum 28 is deposited within the opening 24. Although any one of a number of known platinum plating baths can be used, an electroplating bath of the Sel Rex Corp. known as "Platanex III" was used in this example. The bath is maintained at a temperature of 90° C, plating current is 50 ma and plating time is 1–5 minutes.

After the plating is complete, the chip is removed from the bath, rinsed and dried.

After the deposition of the platinum layers 26 and 28, the photoresist layer 20 is removed. A new photoresist layer (not shown) is deposited and, by conventional masking, exposing and developing techniques, a pattern of resist is defined such that resist is removed where tungsten is to be etched away in the next operation. The resist is baked to further harden it.

Figure 3:
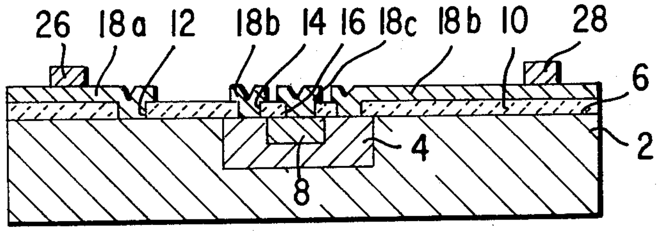

The exposed parts of tungsten layer 18 may be removed by a combination of electrolytic etching and chemical etching using a solution made up of equal parts by volume of 10 percent by weight aqueous sodium hydroxide solution and 10 percent by weight aqueous potassium ferricyanide solution. The process is described in more detail in U.S. Pat. No. 3,560,357 issued Feb. 2, 1971 to J. M. Shaw. This leaves (FIG. 3) a ribbon-like collector connection **18*a*, a base connection 18*b* and an emitter connection 18*c*. The collecter connection 18*a* has a platinum-coated area 26 and the base connection 18*b* has a platinum-coated area 28. The emitter connection 18*c*** may extend to an edge of the body and may also be provided with a platinum-coated area (not shown). After the step of defining the tungsten connector pattern, the chip is again rinsed and dried and the remaining photoresist is removed.

Figure 4:
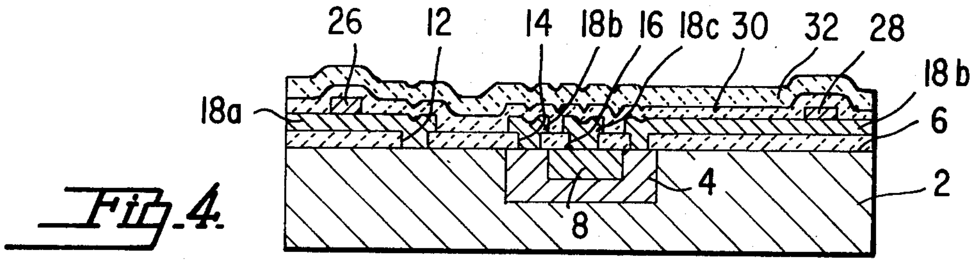

Next, a coating of silicon nitride 30 (FIG. 4) is deposited over the entire top surface of the device including the platinum-coated areas 26 and 28. This may be accomplished by placing the chip in a reactor chamber RF-heated to 800°–850° C. A mixture of silane ($SiH_4$)-in-hydrogen, and ammonia is passed through the heated reactor. The silane is a 3 percent by volume mixture in hydrogen and its flow rate is 30 cc/min. The flow rate of the ammonia is 800 cc/min. Deposition is continued until a layer of silicon nitride 1200–1500 A. thick is deposited.

Then a layer of silicon dioxide 32, about 2500 A. thick (FIG. 4), is deposited on the entire surface of the silicon nitride layer 30. The oxide may be deposited by conventional methods such as reaction between oxygen and either silicon tetrachloride or a silane. The oxide is desirable because it is resistant to the action of hot phosphoric acid which is used to etch the silicon nitride layer. Photoresists are not sufficiently resistant to this etch.

Figure 5:
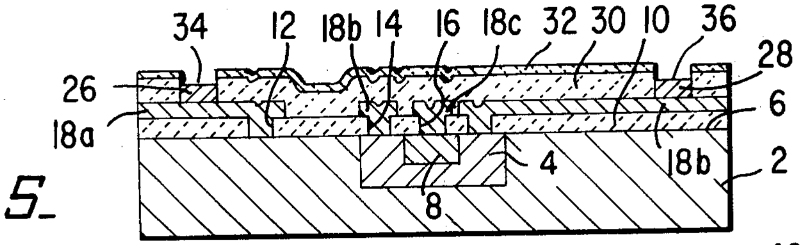

Next, a layer of photoresist (not shown) is applied over the silicon dioxide layer 32. The resist layer is exposed and developed to remove material overlying the platinum-coated areas 26 and 28. The exposed areas of silicon dioxide layer 32 are etched with buffered HF, containing both fluoride and bifluoride, for example, to form an opening 34 (FIG. 5) over platinum land 26 and another opening 36 over platinum land 28. The silicon nitride layer 30 is not etched in this step.

To etch openings in the silicon nitride layer 30, a solution of hot (180° C) phosphoric acid is applied within the openings 34 and 36. The etching rate is about 100 A. min. and etching continues for about 12–15 minutes. If the silicon dioxide were not present as an additional resist, the hot phosphoric acid, in attacking the photoresist, would result in a ragged and uneven etching pattern in the silicon nitride layer.

The hot phosphoric acid does not attack the platinum, hence etching automatically stops in a vertical direction when the platinum coating is reached. Also, the platinum surface is not modified in any way to inhibit subsequent wire-bonding or solder adherence.

The residual photoresist is now removed. The remaining silicon dioxide layer 32 may be optionally removed or permitted to remain.

Figure 6:
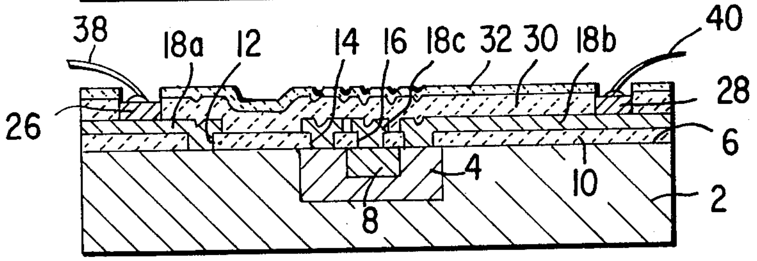
Figure 7:
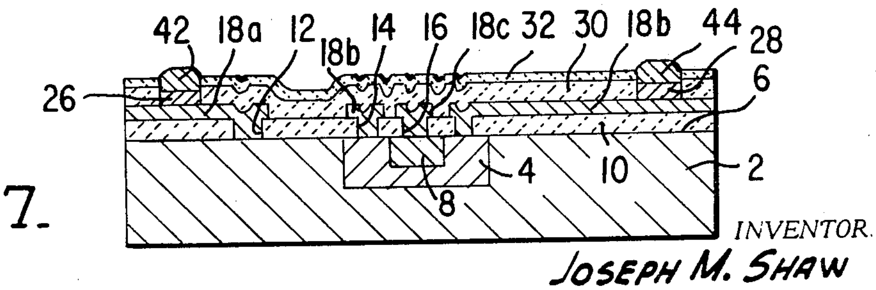

Leads may then be attached in any one of several ways. One way (FIG. 6) is to attach aluminum or gold wires 38 and 40 to platinum-coated areas 26 and 28, respectively by conventional ultrasonic or thermocompression bonding techniques. Another way is to apply molten solder forming solder bumps 42 and 44 (FIG. 7) on the platinum-coated areas 26 and 28, respectively. The solder may be applied by dipping the entire chip in the solder bath and the solder may be either a high or low tin content lead-tin solder or a gold-germanium eutectic solder, for example.

It should be noted that the connection pads are remote from the P-N junctions. The silicon nitride protective layer is continuous over the active areas where the junctions are located.

Figure 8:
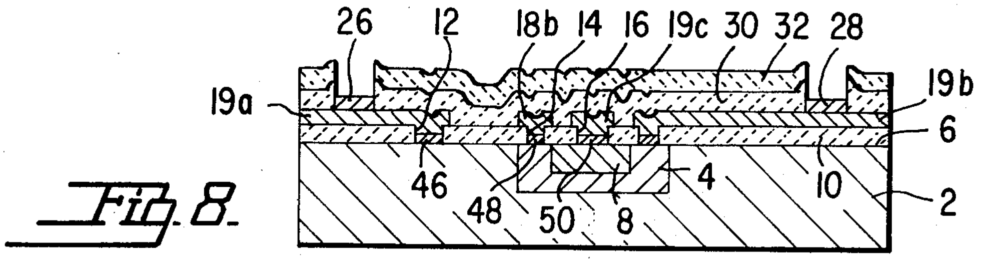

Another alternative form of the device is illustrated in FIG. 8. This embodiment is essentially the same as that illustrated in FIG. 6 except that within each of the openings 12, 14 and 16 there is first deposited a layer of platinum 46, 48 and 50. The assembly is heated to about 500° C. to cause the platinum to react with the silicon of the body to form platinum silicide, and then tungsten layers **19*a*, 19*b* and 19*c* are deposited over the silicon dioxide layer 10 and into openings 12, 14 and 16**, respectively, to make contact to collector, base and emitter regions. The advantage of this form is that good ohmic contact can be made to regions of higher resistivity than if tungsten, alone, is used for the contact.

Figure 9:
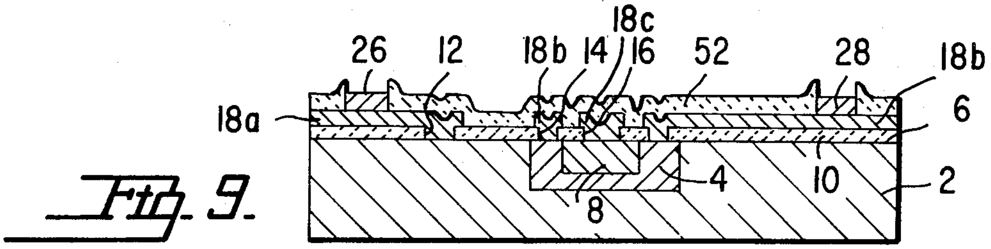

A fourth embodiment is shown in FIG. 9. This embodiment is also essentially like that of FIG. 6 except that a second layer of silicon dioxide 52 is deposited over the first layer of silicon dioxide 10 and the tungsten layers after the tungsten interconnection layers **18*a*, 18*b* and 18*c*** as defined. This omits the previously used silicon nitride layer and provides adequate sealing and passivation for many purposes.

In all of the embodiments shown, the emitter electrode can be extended to a location remote from the emitter region 8 and a platinum pad can be disposed on the tungsten ribbon like the pads 26 and 28 illustrated.

The invention can also be applied to multi-level metallization. Deposited tungsten ribbons can be used as connections over successive layers of silicon nitride or silicon dioxide and platinum can be applied whenever wire bonding or solder connections are desired.

I claim:

1. A monolithic integrated circuit comprising:

a silicon chip having a surface, semiconductor device regions separated by P-N junctions extending to said surface, a coating of insulating material on said surface having openings therein to said regions, a pattern of tungsten electrical connections on said coating and extending into said openings, a coating of platinum on parts of said tungsten connections where leads are to be attached, and a sealing layer of silicon nitride over said silicon dioxide and said tungsten connections except where leads are to be attached to said platinum coating.

2. A circuit according to claim 1 in which said leads are thermocompression bonded wires.

3. A circuit according to claim 1 in which said leads include solder bumps adhering to said platinum.

4. A circuit according to claim 1 in which said platinum coatings are remote from said junctions.

5. A semiconductor device comprising:

a silicon chip having a surface, a coating of silicon dioxide on said surface having openings therein, a coating of platinum silicide on said surface within said openings, a pattern of tungsten electrical connections on said oxide and connecting to said silicide within said openings, a coating of platinum on parts of said tungsten connections where leads are to be attached, and a sealing layer of a protective insulating material over said silicon dioxide and said tungsten except over said platinum coating where leads are to be attached.

* * * * *